United States Patent [19]

Wood

[11] 4,010,492
[45] Mar. 1, 1977

[54] USING A RADIO FEEDBACK LINK TO THE ENGINEER

[76] Inventor: Randolph C. Wood, 301 S. Beverly Glen Blvd., Los Angeles, Calif. 90024

[22] Filed: July 21, 1975

[21] Appl. No.: 597,543

[52] U.S. Cl. .................................. 360/25; 325/66; 360/13
[51] Int. Cl.² ........................ G11B 5/02; H04B 7/00
[58] Field of Search ........... 360/13, 25, 65; 325/65, 325/46, 66

[56] References Cited
UNITED STATES PATENTS

| | | | |
|---|---|---|---|
| 3,735,290 | 5/1973 | Yamazaki | 325/65 |
| 3,743,975 | 7/1973 | Kao | 325/65 |
| 3,794,921 | 2/1974 | Unkauf | 325/65 |

Primary Examiner—Jay P. Lucas
Attorney, Agent, or Firm—Marvin H. Kleinberg

[57] ABSTRACT

A simulation of the audio characteristics of a commercial broadcast channel is provided to permit the person mixing a master recording to hear the recording as it will be heard by the public.

9 Claims, 10 Drawing Figures

Fig. 3

Fig. 4 BLOCK DIAGRAM OF TRANSMITTER

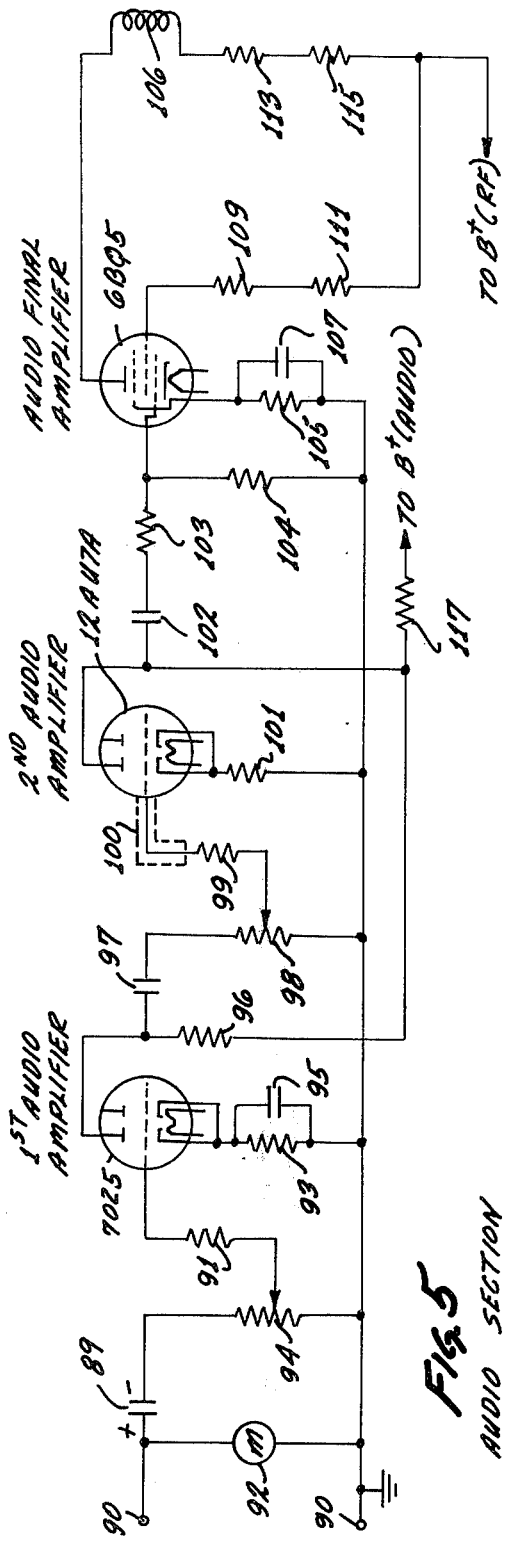
Fig. 5 AUDIO SECTION
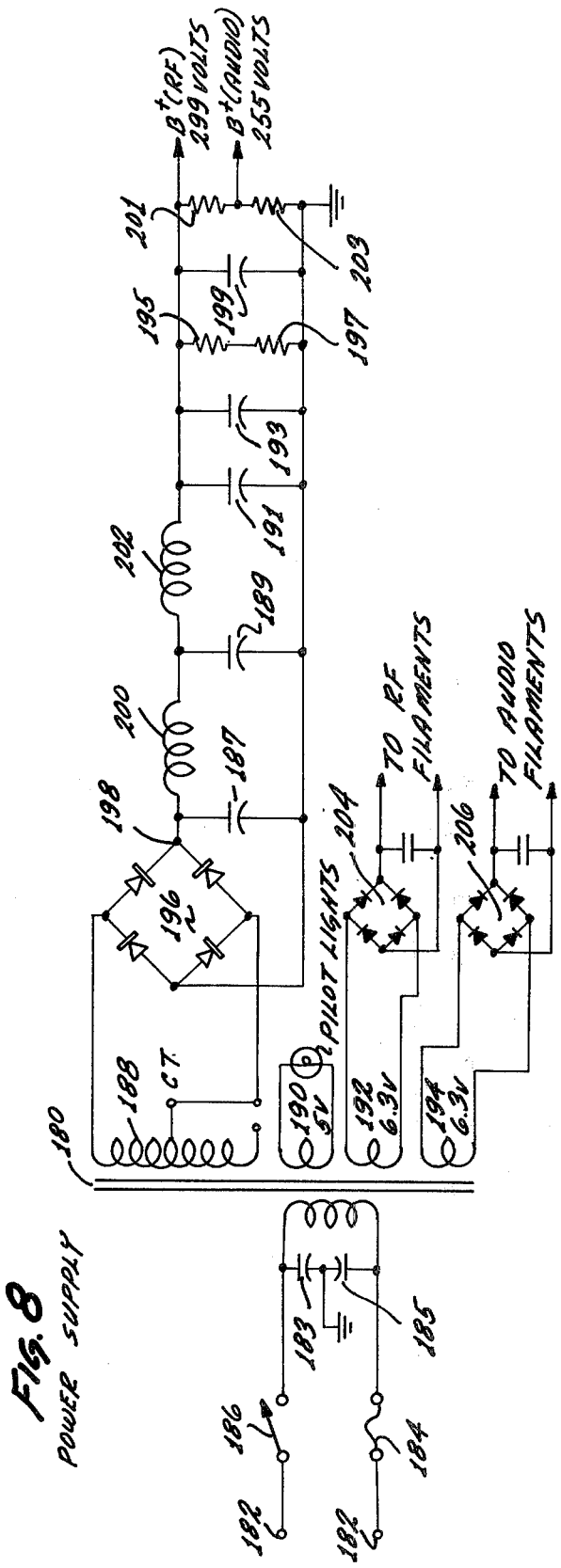
Fig. 8 POWER SUPPLY

RF SECTION

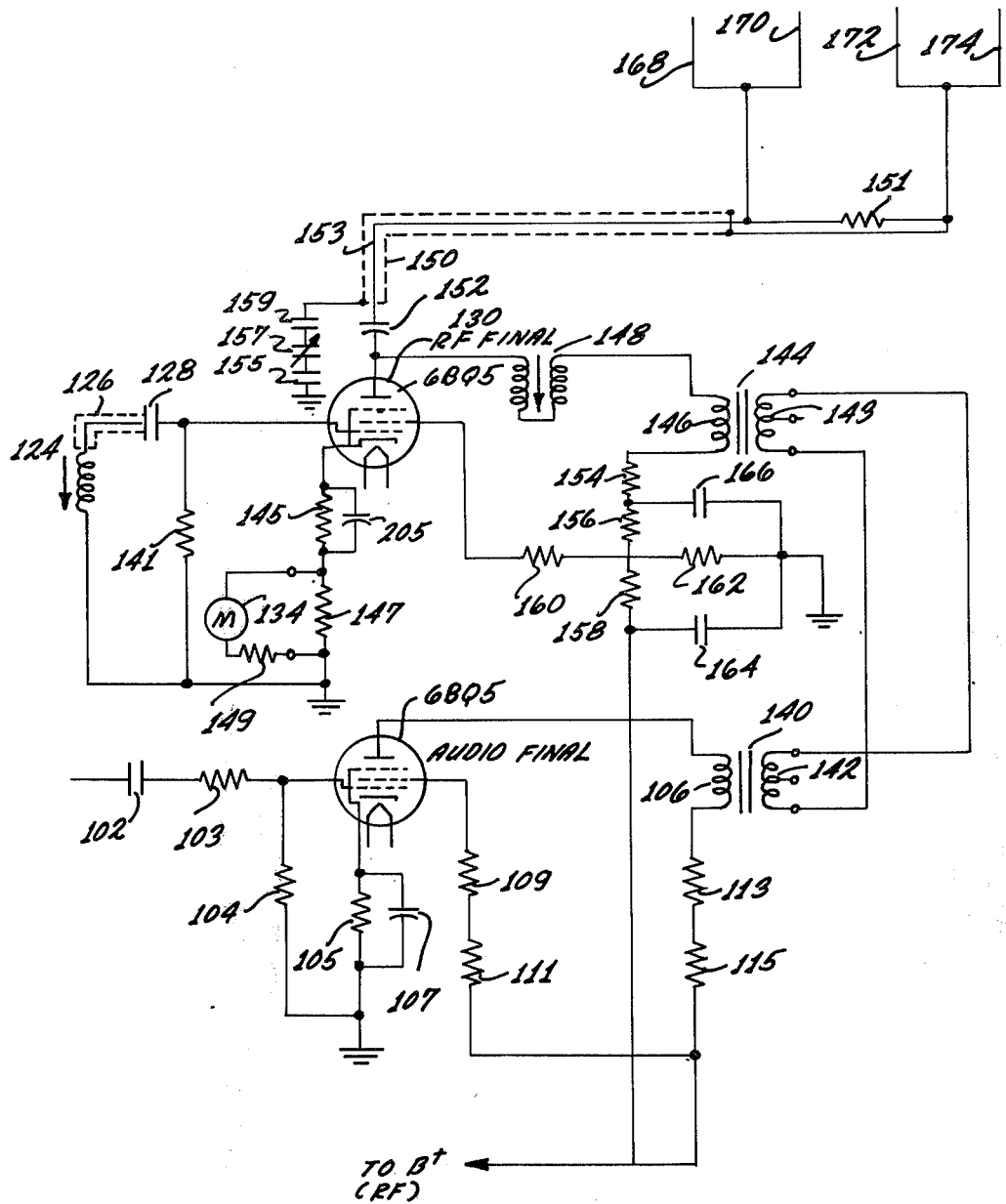

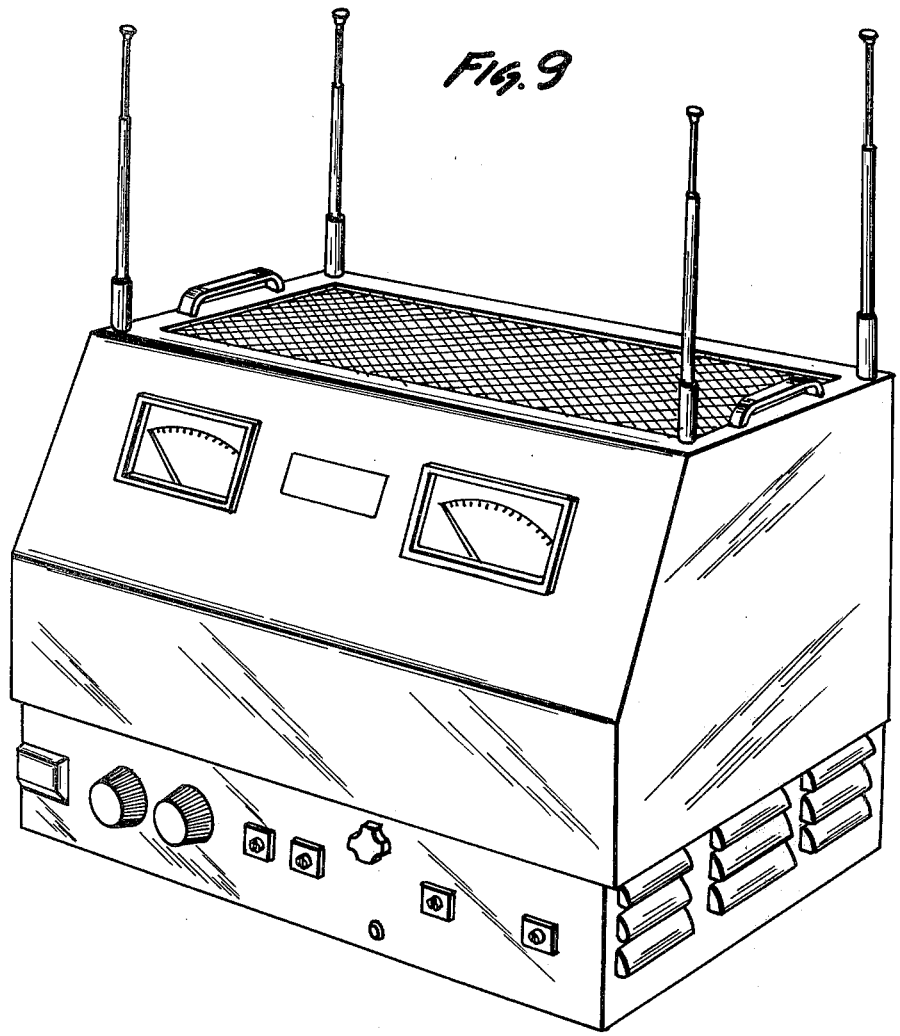
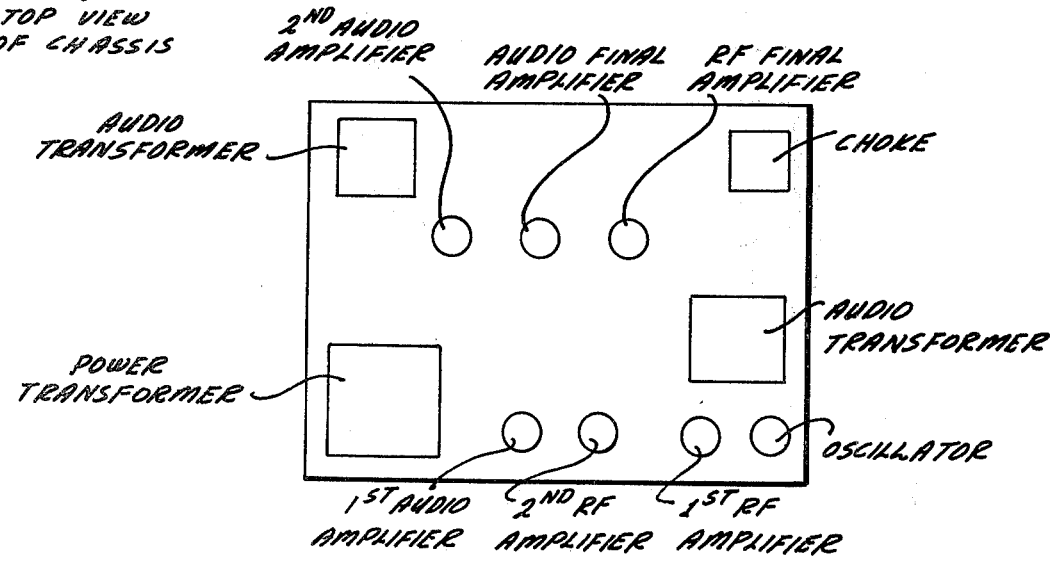

4,010,492

USING A RADIO FEEDBACK LINK TO THE ENGINEER

BACKGROUND OF THE INVENTION

1. Field of the Invention

The present invention is in the field of the production of sound recording, and more specifically relates to an improved method and apparatus for use in the process of producing master recordings.

2. The Prior Art

In a typical contemporary system for producing a master recording, the performance of the artists is recorded by a battery of microphones. The output of each microphone is recorded on an individual track by an audio tape recorder. The multi-track tape thus created forms a permanent storage for the performance, but the multi-track tape is unsuitable for use as a master recording.

A master recording is generated by playing the multi-track tape through a console whereby the signals in the various channels are mixed selectively enhanced or diminished, and filtered to obtain either a two-track tape representing the two channels conventionally used in stereo recordings or a four track tape currently coming into vogue. Clearly, any number of two-track tapes may be generated from the original multi-track tape. The master tape is then utilized to cut a master disc which, in turn, is used to create the stampers from which audio records are pressed.

The mixing and filtering process is, in the conventional technique, controlled by a human operator in accordance with his subjective determination of what constitutes the optimum equalizing, filtering and mixing. If the human operator is unsatisfied with the first two-track master tape produced, he may elect to vary the mixing and produce a second two-track master tape.

Generally, the mixing of the master tape is performed by a very skilled individual who controls the mixing in accordance with his personal judgment while listening to the master tape on extremely high quality monitoring equipment in the studio. This equipment generally includes large, high fidelity speakers and amplifiers. The resulting master tape preserves the sounds heard by the individual doing the mixing and is later transformed into an audio disc.

Unfortunately, most of the persons who will later listen to broadcasts of the audio records of the master tape will not have high quality, studio equipment at their disposal. Instead, the general public will be listening to an audio record as it is transmitted by a commercial transmitter to be received on a wide variety of relatively low quality radio receivers, equipped with low quality speakers.

Naturally, these listeners will not have the same performance that was mixed and recorded. The quality of the sound they hear, optimized for use with studio quality equipment loses something in the transmitting and receiving process. Commercial AM broadcast channels are limited by law to a relatively narrow bandwidth, and this necessarily results in some distortion of high frequency audio components. Further, most of the radios used by the general public have relatively small loudspeakers, resulting in some distortion of the low frequency audio components.

It has been found that a master tape optimized for studio quality equipment does not result in the best possible sound that can be achieved on the relatively low quality radio receivers used by the listening public.

On the contrary, it has been found that the master tape can be mixed in such a way that the quality of the sound heard by the listening public can be considerably improved.

This can be accomplished, according to the teaching of the present invention, by mixing the sounds recorded on the master tape in such a way as to compensate for the limitations of the relatively low quality radio receivers used by the public. This compensation can be achieved, according to the present invention, by stimulating, in the monitoring loop, the audible qualities of a broadcast transmitter and a receiver typically used by the public.

SUMMARY OF THE INVENTION

To permit mixing of the master tape so as to optimize the sound hear by the listening public, the present invention teaches the use of a particular high fidelity, low power transmitter, for broadcasting and monitoring the signals being recorded on the master tape while it is being mixed so as to permit the person mixing the master tape to hear the sound on an inexpensive radio receiver.

Both the special transmitter described above, and the inexpensive receiver are normally located in the recording studio, but the only connection between them is by radio waves. This improved master tape-making technique taught by the present invention results in the great improvement of the performance that can be mixed to be heard by the listening public.

The transmitter circuit has audio qualities that permit it to simulate with great fidelity the audible characteristics, recognized by trained individuals, of commercial broadcast transmitters. Thus, the technique of the present invention includes within the monitoring feedback loop, a simulation of the audible qualities of both the broadcasting station and the receivers used by the listening public.

The novel features which are believed to be characteristic of the invention, both as to organization and method of operation, together with further objects and advantages thereof, will be better understood from the following description considered in connection with the accompanying drawings in which several preferred embodiments of the invention are illustrated by way of example. It is to be expressly understood, however, that the drawings are for the purpose of illustration and description only and are not intended as a definition of the limits of the invention.

BRIEF DESCRIPTION OF THE DRAWINGS

FIG. 3 is a block diagram of the additional circuits used for cutting disc records;

FIG. 4 is a block diagram of the transmitter of the present invention;

FIG. 5 is a schematic diagram of the audio section of the transmitter;

FIG. 7 is a schematic diagram of the modulator section of the transmitter;

FIG. 8 is a schematic diagram of the power supply section of the transmitter; and FIG. 9 is a perspective view of the packaged transmitter unit;

FIG. 10 is a top view of the chasis showing how the parts are arranged in a preferred embodiment; and Table 1 is a parts list showing the values of the components used in a preferred embodiment.

DESCRIPTION OF THE PREFERRED EMBODIMENT

Figure 1:
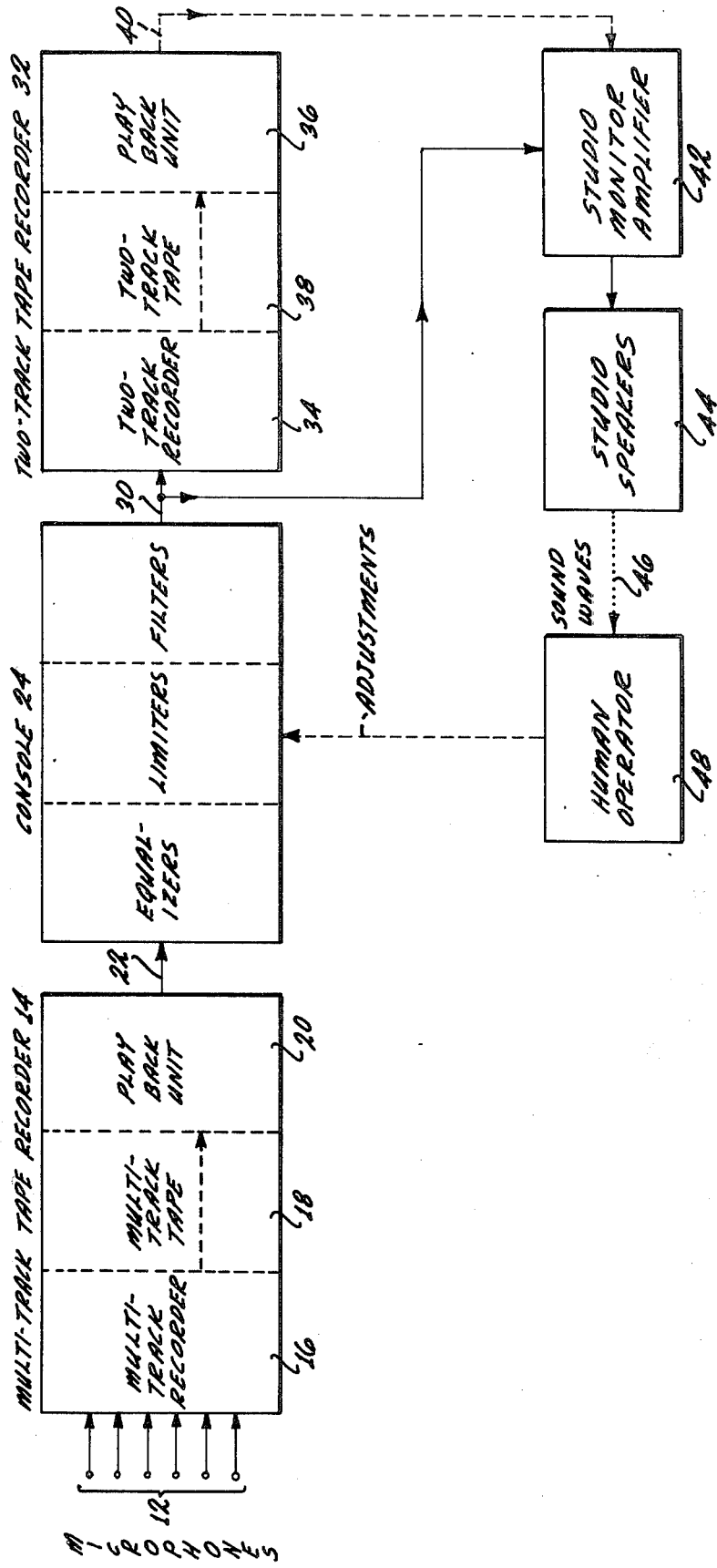
FIG. 1 is a block diagram showing a conventional prior art system.

Referring now to the drawings, FIG. 1 shows a typical prior art system for creating a master tape. In that system, the sounds to be recorded are picked up by a battery of microphones denoted collectively by 12, each of which generates an electrical signal as the input to an individual audio channel. These microphones are all connected to the inputs of a multi-track tape recorder 14, which further comprises a multi-track recorder 16 for recording the signal generated by the microphone 12 as separate channels or tracks on a multi-track tape 18.

This tape 18 preserves the sounds as sensed by microphone 12. The multi-track tape 18 can be played back immediately, or subsequently by use of the playback unit portion 20 of the multi-track tape recorder 14. When the tape is played back, playback unit 20 converts the signals recorded on the tape to electrical signals represented collectively by 22. These signals next enter console 24 which has adjusting means for equalizing, limiting and filtering the signals 22 in each of the several channels.

Console 24, in addition to a number of equalizers, limiters and filters, further includes a patchboard bay and mixing networks to permit the various channels to be combined in controllable proportions while maintaining the capability of equalizing, limiting and filtering the individual channels so combined. The output of console 24 may be predetermined to consist of four, two or one channel depending on whether quad sound, stereo sound, or monaural sound is desired. These various output capabilities are represented collectively as output 30.

After being equalized, limited and filtered, the individual channels are combined and fed to, for example, the two-track tape recorder 32. Tape recorder 32 includes a recording unit 34 and a playback unit 36. The two channels or two-track tape 38 may, if its quality justifies it, become the master tape.

In the system of the prior art the input 30 to the recorder 34 is fed to a studio monitor amplifier 42 where it is amplified sufficiently to enable it to drive the studio speakers 44. Alternatively, the output 40 of playback unit 36 could be used as the input to the studio monitor amplifier 42, as indicated by the dashed line in FIG. 1. Studio speakers 44 and the studio monitor amplifier 42 are of very high fidelity. Furthermore, they are capable of producing a large amount of sound energy which emanates from the relatively large area of the studio speakers 44. Because most human mixers feel they have to listen to the studio speakers at a sound level of 90 to 100 decibels to detect the more subtle nuances of the blended component sounds, the hearing life of human mixers tends to be limited.

The sound waves 46 produced by the studio speakers 44 are monitored by the human operator 48, who manually adjusts the audible qualities of the sound being heard or visualized on appropriate CRT or other meters and indicators on the console, the sound mixer can exercise his professional judgment and skill to create a recorded composite performance.

It can be seen that console 24, studio monitor amplifier 42, studio speakers 44, and the human operator 48, together form a feedback loop for monitoring and modifying the audible quality of the signals recorded on the two-track tape 38. Unfortunately this feedback loop does not contain within its means which permit the mixer to hear how the performance will sound after being broadcast by a commercial radio transmitter and received on a typical receiver. Because of this deficiency in the feedback loop, it is impossible for a mixing expert to utilize the system of the prior art to optimize the signals recorded on the master tape for use in the intended broadcast channel.

Figure 2:
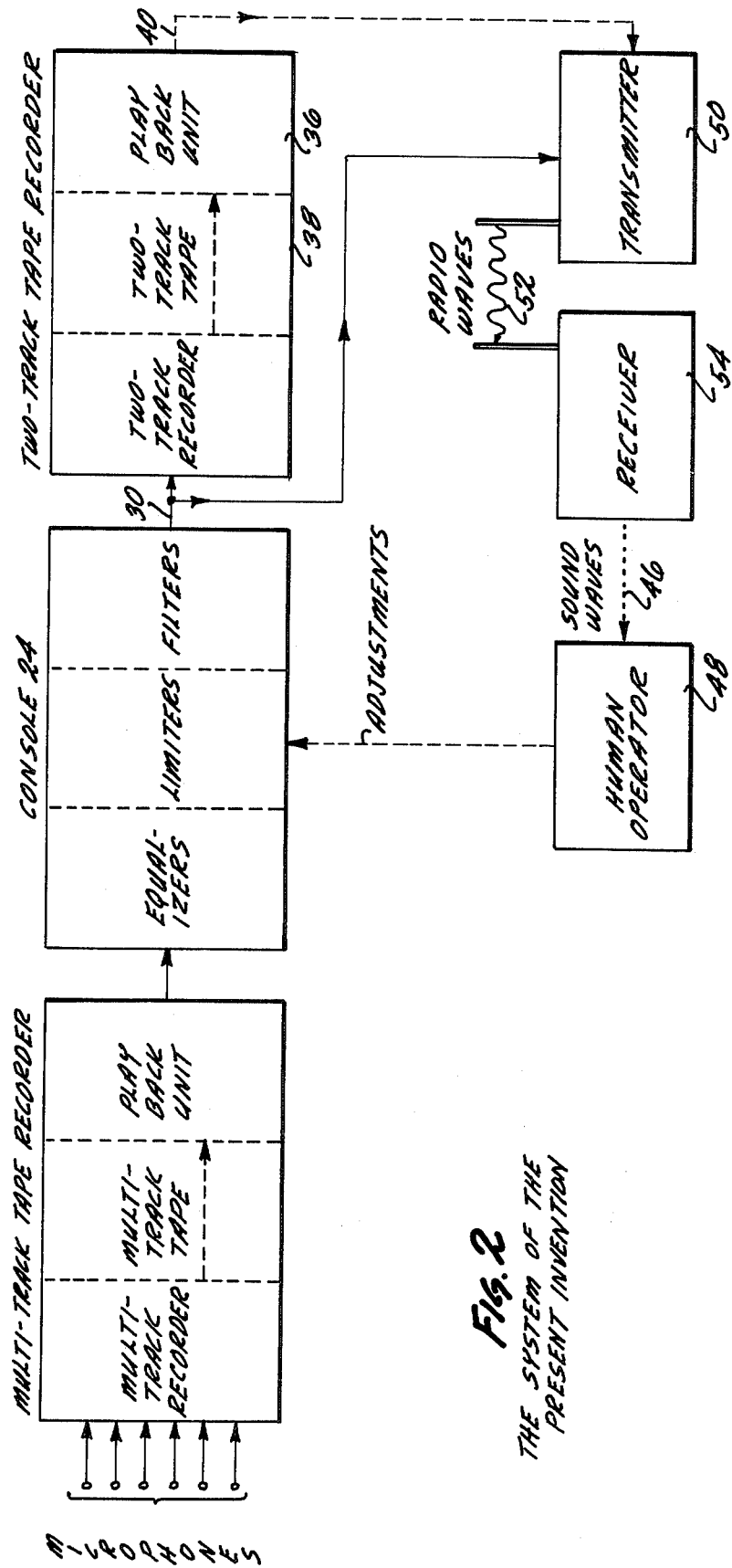
FIG. 2 is a block diagram showing the system of the present invention.

The system of the present invention, shown in block diagram form in FIG. 2, overcomes this serious deficiency of the prior art. In the system of the present invention, the output 30 of the console 24 is fed to a transmitter 50, which combines the two or four channels into a single channel and broadcasts the output 30, simulating the operation of a commercial broadcasting transmitter within the band width limitations of conventional AM transmitters. The radio waves 52 broadcast by transmitter 50 form the only connection between transmitter 50 and a receiver 54.

Radio waves 52 are received by the receiver 54 which converts them to sound waves 46. Receiver 54 may be any one of a number of relatively low-quality receivers of the type intended for home and portable use. The receiver 54 typically is not capable of high fidelity reproduction of the signal carried by the radio waves, and typically, the speaker of receiver 54 is a relatively small, and relatively low energy source of sound waves 46.

The human operator 48, while listening to these sound waves 46, is able to adjust the various control elements on console 24 to optimize the qualities of the sound he hears according to his professional judgment. This in turn, permits optimization of the two-track master tape 38 which ultimately becomes an audio disc which is used in the normal broadcast channel.

It is seen that the system of the present invention, unlike that of the prior art, includes in the feedback loop an AM broadcast channel, including an AM transmitter 50, radio waves 52 transmitted through the atmosphere, and relatively low quality receiver 54.

The ability of the system of the present invention to optimize the performance on the master tape 388 for use in a broadcast channel naturally depends on the ability of the transmitter 50 to simulate as precisely as possible the audio characteristics of a typical commercial broadcasting transmitter. Thus, the method and system of the present invention derives its usefuleness from the unique design used for the transmitter 50. Further, the use of such a transmitter in a master recording system is a unique feature of the present invention.

Figures 3, 4:
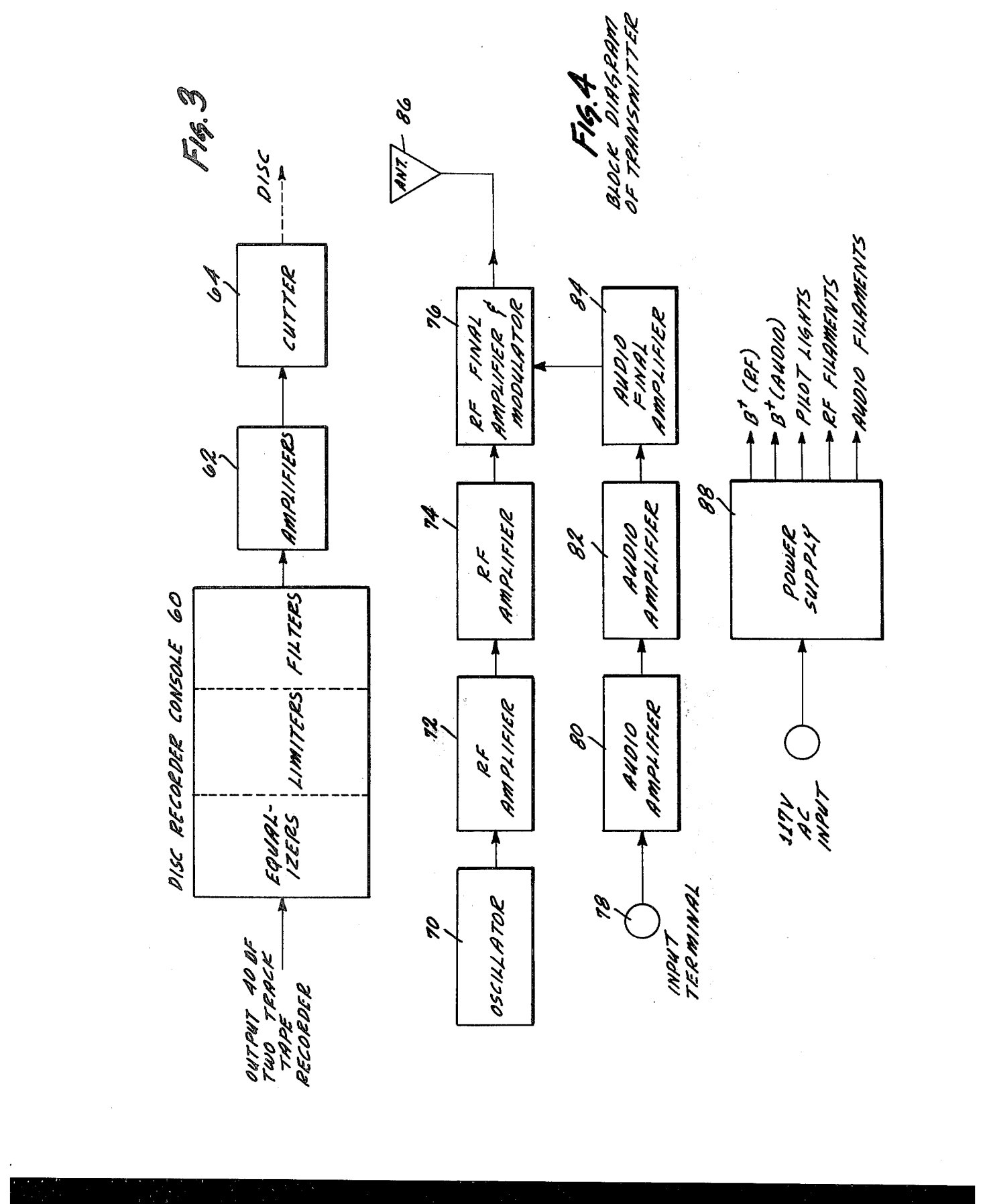

Once the human operator is satisfied with the sound recorded on the master tape 38, he can use the master tape if desired, to produce a phonograph disc. A part of the system for doing this is shown in FIG. 3. The output 40 of the two-track tape recorder is fed to a disc recorder console 60 which includes equalizers, limiters and filters and, in general, very much resembles the console 24 of FIGS. 1 and 2. The output of the disc recorder console 60 is fed to additional stages of amplification 62, and finally, is fed to a cutter 64, which is used to cut the master disc. At a later stage of the process, (not shown), the master disc is used in conventional processes to create the stamper from which phonograph records may be mass-produced.

As explained above, the usefulness of the system of the present invention depends upon the ability of transmitter 50 to simulate the audio characteristics of commercial AM broadcasting transmitters. Although the design of vacuum tube transmitters in general is well known to the art, the Applicant knows of no prior art which would permit the desired audio characteristics of a commercial AM transmitter to be designed into a small, limited ranged transmitter suitable for use in a studio. Thus, starting with the decision to use vacuum tubes to better simulate the sound of commercial transmitters, which use vacuum tubes, Applicant designed, built and tested the transmitter by trial and error techniques. The resulting transmitter is believed to be new, useful, and unobvious, as attested by its favorable reception within the industry.

Applicant is unable to determine which element or group of elements of the transmitter results in its unique audio characteistics. It is believed that these characteristics result not from any single component but rather from the unique combination of components and component values used throughout the system.

FIG. 4 is a block diagram of the transmitter. The transmitter is of the single channel, amplitude modulated type. A radio frequency signal is generated by oscillator 70, and this signal is amplified by RF amplifiers 72 and 74. A final stage of r.f. amplification is provided by the amplifier/modulator 76. The transmitter will accept audio signals from a variety of sources including microphones, tape, or monitor console output signals. Regardless of the source, these audio inputs are connected to the transmitter at terminal 78. The input signal is amplified by three stages 80, 82, 84 of audio amplification. The output of the final stage of audio amplification 84 is used to modulate the final stage of r.f. amplification as will be described in greater detail below. The modulated output of the final RF stage 76 is applied to antenna 86.

The transmitter includes an integral power supply 88 designed to operate from a primary power source of 117 volts a.c. The power supply 88 furnishes the transmitter with high voltage plate supplies for both the r.f. and audio vacuum tubes and also supplies separate r.f. and a.f. filament power.

FIG. 5 is a schematic diagram of the audio section of the transmitter. The audio section will accept signals from the microphone, from a monitor console, or from a tape playback unit. The audio input device may have any impedance and is connected between the terminals indicated at 90 in FIG. 5.

A meter 92 is provided to monitor the magnitude of the input signal to be adjusted to a workable value for use with the first stage of audio amplification.

The first stage of audio amplification makes use of half of a type 7025 vacuum tube triode. The other half of the vacuum tube is not used at all. The output of the first stage audio amplifier is resistance coupled to a second stage of audio amplification, employing half of a 12AU7A vacuum tube triode. Again, a potentiometer 98 is provided to permit control of the input signal to a workable value. Shielding 100 is provided on the input lead to the second audio amplifier.

The output of the second audio amplifier is resistance coupled to a final stage of audio amplification, making use of a type 6BQ5 vacuum tube pentode. Both the screen grid and the plate of the 6BQ5 pentode are connected through appropriate resistors to the B+(RF) power supply voltage whereas, the plates of the first and second stages of audio amplification are connected to the B+(audio) power supply voltage.

The suppressor grid of the 6BQ5 is connected internally to the cathode of the tube. The current flowing through the plate circuit of the final stage audio amplifier must pass through the winding 106 of a transformer which is used to couple the audio signal to the modulator portion of the transmitter, as will be described below.

Figure 6:
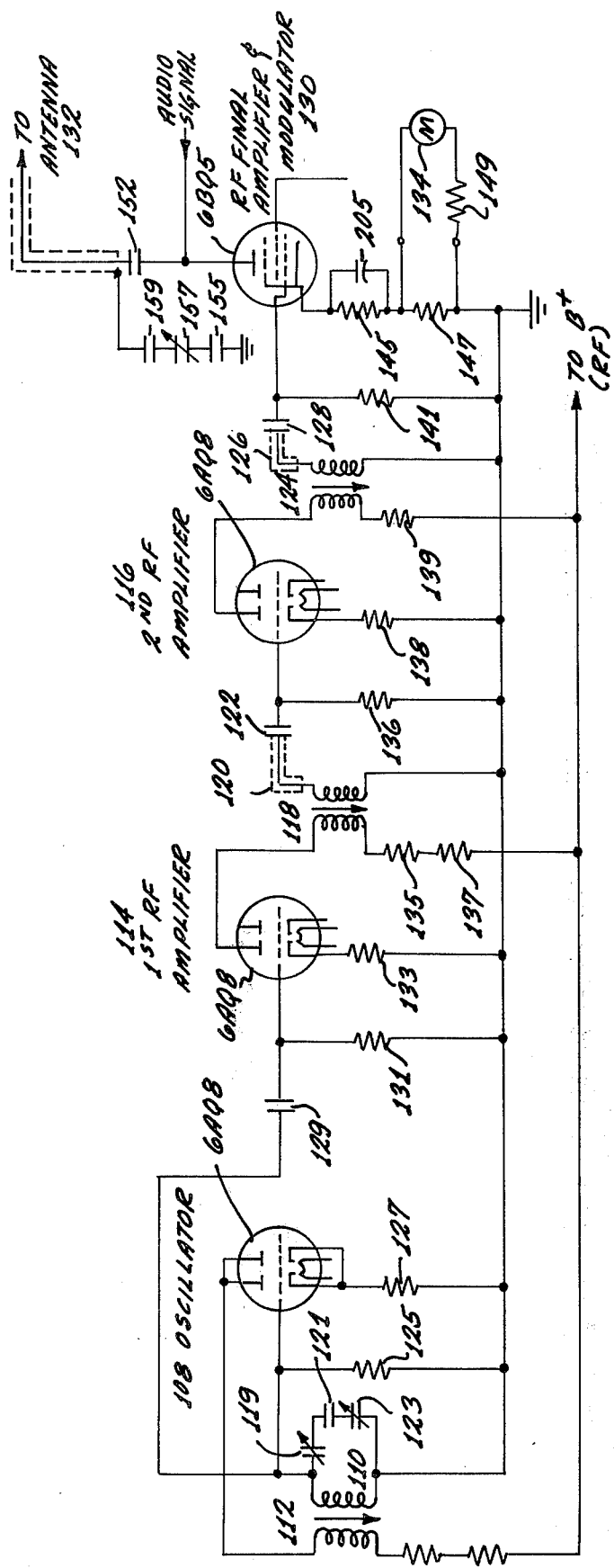
FIG. 6 is a schematic diagram of the radio frequency section of the transmitter.

FIG. 6 is a schematic diagram of the r.f. section of the transmitter. The RF signal is generated by oscillator using both halves of a type 6AQ8 vacuum triode connected in parallel.

The frequency of oscillator is controlled by tuned circuit 110 which has variable capacitors for effecting the tuning and which is energized by the plate current through transformer 112. Transformer 112 is a Miller oscillator coil No. A5495C. The voltage generated in the tuned grid circuit 110 rather than the plate output voltage of the oscillator is resistance-coupled to a first radio frequency (r.f.) amplifier 114. Thus, oscillator 108 generates a very clean r.f. signal.

That signal is amplified by the first stage r.f. amplifier 114 and then transformer-coupled to a second r.f. amplifier 116, through coupling transformer 118. Shielding 120 is provided between the secondary winding of transformer 118 and coupling capacitor 122.

The output of the second RF amplifier 116 is coupled to the final r.f. amplifier 130 by a coupling transformer 124 and coupling capacitor 128. Again, shielding is provided between the secondary winding of coupling transformer 124 and coupling capacitor 128.

The oscillator 108 and the first and second stages of RF amplification 114 and 116 respectively, make use of type 6AQ8 vacuum tube triodes. The final stage of r.f. amplification is provided by a type 6BQ5 pentode. It is in the final r.f. amplifier that the audio signal is used to modulate the r.f. signal to produce an amplitude modulated signal which is applied to antenna 132, a meter 134 is provided to measure the current flowing through the cathode circuit of the final r.f. amplifier 130. This is used as a measure of the output power of the transmitter.

The operation of the modulator can best be understood with reference to FIG. 7, which repeats portions of FIGS. 5 and 6. The final audio output, as described above is fed through primary winding 106 of transformer 140. The transformer 140 is an audio transformer as is transformer 144. The audio output is link-coupled through the link circuit comprising windings 142 and 143 to the primary winding 146 of transformer 144. In the absence of an audio signal, the plate of the final r.f. amplifier is connected through r.f. coil 148, primary winding 146 and resistors 154, 156 and 158 to B+(RF). Coil 148 prevents the r.f. output from entering the power supply and the audio circuits.

When an audio signal is present, the voltage induced in winding 146 augments or opposes the voltage applied to the plate of the final stage of r.f. amplification. This in turn modulates the amount of r.f. signal applied to the antenna in accordance with the magnitude of the audio frequency signal. The output of the final r.f.

amplification stage is coupled to the antenna through capacitor 152, and the antenna feed wire 153 is shielded by shield 150 to reduce pickup. The screen grid of the type 6BQ5 pentode is biased through the resistance network comprising resistors 160, 162, 158, 156, 154 and capacitors 164 and 166. It has been found that the presence of capacitors 164 and 166 has a beneficial effect on the audio performance of the transmitter.

FIG. 8 shows the power supply used in the transmitter. The primary source of alternating current voltage is applied at terminals 182. One line includes an on-off switch 186 while the other input line includes fuse 184. The input lines lead to the primary winding of the power transformer 180. Transformers 180 has separate secondary windings including winding 194 for the audio filamets, winding 192 for the r.f. filaments, winding 190 for the pilot lights and winding 188 for the B+ power supply. Winding 188 is center tapped and connected to a full-wave bridge rectifier 196. The output of the rectifier 196 at point 198 is approximately 310 volts. This output is smoothed by a capacitor input filter including a first choke 200 and a second choke 202. Further capacitors, a bleeder resistance and a voltage divider are included. The secondary windings 192 are connected to separate full-wave diode-bridge rectifiers 204 and 206 and the outputs of these rectifiers are smoothed by capacitors prior to being applied to the r.f. filaments and the audio filaments respectively.

The power supply shown in FIG. 8 was specifically designed for use with the transformer and is particularly adapted to providing the required voltages with a minimum of hum and ripple.

FIG. 9 is a perspective view showing the console of the transmitter as it is packaged in the present embodiment.

FIG. 10 is a top view of the chassis of the preferred embodiment of the invention showing the layout of the components on the chassis. It can be seen that the inductive elements have been separated as far as possible, to minimize crosscoupling.

Table 1 is a parts list showing the values of the components used in the preferred embodiment.

Thus there has been described a preferred embodiment of a transmitter for simulating the audio qualities of high power broadcast transmitters while making use of low power components and broadcasting at low power output.

The output power of the transmitter is controlled to a relatively low level by several techniques. First, the interstage coupling capacitors in the r.f. section are extremely small, resulting in a capacitive reactance at the frequencies used on the order of a megohm. This assures that the input to each stage is a relatively small signal, well within the range of signals for which linear operation can be achieved.

Secondly, the degree of tuning between the various stages of r.f. amplification can be adjusted to produce a low level output. Potentiometers are supplied between the audio amplification stages to permit a relatively low level of audio signal to be produced.

Finally, the use of a compact, directional antenna further assures that the broadcast range of the transmitter will not be excessive, preferably less than 100 feet.

The transmitter uses vacuum tubes because it has been found that vacuum tubes give a "warmer" sound than transistors, which are said to give a more "crisp" sound. Because low level signals are used throughout the system, the operation of the entire transmitter is extremely linear. Measurements have shown that the frequency response of the transmitter is flat to within 0.05 decibels over the range from 7 Hz to 30 kHz.

Electrical interference between the various parts of the transmitter is minimized by several techniques including judicious arrangements of the parts on the chassis, use of shielding on sensitive lead wires, and the use of a specially designed power supply.

All of the components used in the transmitter are greatly derated. That is, the components are capable of handling signals many times larger than those actually employed. As a result, the transmitter can operate continuously, which further enhances the simulation of commercial broadcast transmitters.

Thus there has been shown and described an improved system for producing master recordings by adding to the system of the prior art a simulation of the audio characteristics of a commercial AM broadcasting transmitter and of a typical low quality receiver. Further, there has been shown and described a novel low-power transmitter having audio transmitting qualities simulating closely those of a high-power broadcasting transmitter.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. In a system for producing a master recording having means for filtering and mixing a number of input audio signals prior to recording them as a master recording and wherein an operator controls the means for filtering and mixing of the signals in response to an audible presentation of the filtered and mixed signals, the improvement comprising:
   means responsive to the filtered and mixed signals to produce through a radio link the audible presentation used by the operator to control said means for filtering and mixing.

2. In a system for producing a master recording having means for filtering and mixing a number of input audio signals prior to recording them as a master recording and wherein an operator controls the means for filtering and mixing of the signals in response to an audible presentation of the filtered and mixed signals, the improvement comprising:
   a. transmitting means having a predetermined audio frequency response and responsive to the filtered and mixed signals to produce a radio signal; and,
   b. receiving means responsive to said radio for producing the audible presentation used by the operator to control the means for filtering and mixing.

3. The improvement of claim 2 wherein said transmitting means further comprise a vacuum tube amplitude modulated transmitter.

4. The improvement of claim 3 wherein said transmitter has a frequency response to audio input which is flat to 0.05 decibels over the range 7Hz to 40kHz.

5. The improvement of claim 2 wherein said receiving means is a relatively low fidelity radio broadcast receiver.

6. In a process for producing a master recording by filtering and mixing a number of input audio signals prior to recording them as a master recording, and wherein an operator controls the filtering and mixing of the signals in response to an audible presentation of the filtered and mixed signals, the improvement comprising the steps of:
 a. transmitting the filtered and mixed signals from a radio transmitter;
 b. receiving the transmitted signals on a radio receiver to produce the audible presentation of the filtered and mixed signals; and,
 c. controlling the filtering and mixing of the input audio signals in response to the audible presentation.

7. In a process for producing a master recording by filtering and mixing a number of input audio signals prior to recording them as a master recording, and wherein an operator controls the filtering and mixing of the signals in response to an audible presentation of the filtered and mixed signals, the improvement comprising the steps of:
 a. transmitting the filtered and mixed signals from a radio transmitter having a frequency response that is substantially flat over the range from 7 Hz to 30 KHz; and
 b. receiving the transmitted signals on a relatively low fidelity radio broadcast receiver to produce the audible presentation of the recorded signals.

8. In a process for producing a master recording by filtering and mixing a number of input audio signals prior to recording them as a master recording, and wherein an operator controls the filtering and mixing of the signals in response to an audible presentation of the filtered and mixed signals, the improvement comprising the step of transmitting the filtered and mixed signals over a radio link to produce the audible presentation used by the operator to control the filtering and mixing of the signals.

9. In a process for producing a master recording by filtering and mixing a number of input audio signals prior to recording them as a master recording, and wherein an operators controls the filtering and mixing of the signals in response to an audible presentation of the filtered and mixed signals, the improvement comprising the steps of:
 a. transmitting the filtered and mixed signals from a radio transmitter; and,
 b. receiving the transmitted signals on a radio receiver to produce the audible presentation of the filtered and mixed signals used by the operators to control the filtering and mixing of the input audio signals.

* * * * *